United States Patent
Niskanen

(10) Patent No.: US 12,410,516 B2
(45) Date of Patent: Sep. 9, 2025

(54) CONTAINER FOR EFFICIENT VAPORIZATION OF PRECURSOR MATERIALS AND METHOD OF USING THE SAME

(71) Applicant: ASM IP Holding B.V., Almere (NL)

(72) Inventor: Antti Niskanen, Helsinki (FI)

(73) Assignee: ASM IP Holding B.V., Almere (NL)

( * ) Notice: Subject to any disclaimer, the term of this patent is extended or adjusted under 35 U.S.C. 154(b) by 593 days.

(21) Appl. No.: 17/563,158

(22) Filed: Dec. 28, 2021

(65) Prior Publication Data

US 2022/0205088 A1 Jun. 30, 2022

Related U.S. Application Data

(60) Provisional application No. 63/132,508, filed on Dec. 31, 2020.

(51) Int. Cl.
| | |
|---|---|
| *C23C 16/448* | (2006.01) |
| *C23C 16/455* | (2006.01) |
| *C23C 16/52* | (2006.01) |
| *C23C 16/54* | (2006.01) |

(52) U.S. Cl.
CPC ...... *C23C 16/448* (2013.01); *C23C 16/45561* (2013.01); *C23C 16/52* (2013.01); *C23C 16/54* (2013.01)

(58) Field of Classification Search
CPC ......... C23C 16/448–452; C23C 16/045; F28D 1/047–0478
See application file for complete search history.

(56) References Cited

U.S. PATENT DOCUMENTS

| | | | |
|---|---|---|---|
| 6,265,026 B1* | 7/2001 | Wang | C23C 16/4481 427/255.28 |
| 10,147,597 B1 | 12/2018 | Lee et al. | |
| 2005/0000425 A1* | 1/2005 | Fairbourn | C23C 16/08 118/723 VE |
| 2007/0012374 A1* | 1/2007 | Yasuda | F16L 11/11 138/140 |
| 2008/0191153 A1* | 8/2008 | Marganski | C23C 14/48 134/107 |
| 2016/0289822 A1* | 10/2016 | Beck | F25B 39/00 |
| 2020/0056283 A1 | 2/2020 | Shero | |

FOREIGN PATENT DOCUMENTS

| | | |
|---|---|---|
| CN | 102388162 A | 3/2012 |
| CN | 105422285 A | 3/2016 |
| WO | 2012042035 A1 | 4/2012 |

* cited by examiner

*Primary Examiner* — Dah-Wei D. Yuan
*Assistant Examiner* — Stephen A Kitt
(74) *Attorney, Agent, or Firm* — Laine IP Oy; Mark W. Scott

(57) ABSTRACT

A precursor vessel for a vapor deposition process is disclosed. The vessel includes a housing having an inlet, an outlet, and defining an interior volume. A tube is disposed within the interior volume and extends from the inlet to the outlet. The tube has sidewalls defining a flowpath therethrough. The sidewalls have an internal surface facing the flowpath having a plurality of depressions in the internal surface having a depth and a width. A solid precursor material may be loaded into the depressions. A system including the precursor vessel and a vapor deposition process are further disclosed herein.

21 Claims, 6 Drawing Sheets

CONTAINER FOR EFFICIENT VAPORIZATION OF PRECURSOR MATERIALS AND METHOD OF USING THE SAME

FIELD

The present disclosure relates generally to semiconductor processing equipment, and specifically to containers, systems, and methods for chemical vapor delivery.

BACKGROUND

A typical precursor delivery system for vapor a deposition process includes a solid or liquid source vessel (precursor vessel) including the precursor. In the case of a solid precursor, the precursor vessel includes a solid material to be vaporized. In the case of a liquid precursor, the precursor vessel includes a liquid material to be vaporized. Once vaporized, a carrier gas sweeps precursor vapor along with it through a vessel outlet and ultimately to a substrate in a reaction chamber, or the precursor is vaporized at low pressure or under vacuum. Process control may be challenging, especially for solid precursors. In many instances, achieving sufficient vaporization of the solid precursor to achieve desired concentrations of the precursor material requires heating the solid precursor to substantially elevated temperatures. Maintaining a solid precursor at elevated temperatures for extended periods of time, however, may cause agglomeration of the solid precursor, thereby leading to the reduction of precursor surface area available for vaporization. In addition, elevated temperatures may result in thermal degradation of the precursor material. Further, in known bubblers for use in vapor deposition, the precursor material or vapor may exist in locations which are not in contact with any gas flow. These effects may further lead to inefficiencies in the vaporization process and alterations in dose behavior of the precursor and consequently in the properties of the deposited material.

Therefore, there is a strong need in the art for improving the effectiveness and efficiency of vaporizing a precursor material for a vapor deposition process.

SUMMARY

In a first aspect, a precursor vessel for a vapor deposition process is disclosed. The vessel comprises a housing having an inlet, an outlet, and defining an interior volume. A tube is disposed within the interior volume and extends from the inlet to the outlet. The tube has sidewalls defining a flowpath there through. The sidewalls comprise an internal surface facing the flowpath having a plurality of depressions in the internal surface having a depth and a width.

In a second aspect, a precursor vessel for a vapor deposition process is disclosed. The vessel comprises a housing having an inlet, an outlet, and defining an interior volume. A tube is disposed within the interior volume and extends from the inlet to the outlet. The tube has sidewalls defining a flowpath there through. The sidewalls comprise an internal surface facing the flowpath having a plurality of depressions in the internal surface having a depth and a width. A precursor material is disposed within the plurality of depressions. In some embodiments, the precursor material is solid. In some embodiments, the precursor material is liquid.

In a third aspect, a vapor deposition system is also disclosed. The assembly comprises a source of a carrier gas; a reaction chamber for holding a substrate therein; and a precursor vessel comprising: a housing having an inlet in fluid communication with the source of carrier gas, an outlet in fluid communication with the reaction chamber, and defining an interior volume; and a tube disposed within the interior volume and extending from the inlet to the outlet. The tube comprises sidewalls defining a flowpath there through which a carrier gas from the carrier gas source flows and including a quantity of a precursor material therein. The sidewalls comprise an internal surface facing the flowpath having a plurality of depressions in the internal surface having a width and a depth, wherein the precursor material is disposed within the depressions. Upon keeping the precursor material at a vaporization temperature of the precursor material, the carrier gas carries the vaporized precursor material to the reaction chamber for deposition of a material on the substrate.

In a fourth aspect, a method for vaporizing a precursor material for a vapor deposition process is disclosed. The process comprises: directing a carrier gas into a precursor vessel comprising inlet, an outlet, and defining an interior volume, wherein the vessel further comprises a tube disposed within the interior volume extending from the inlet to the outlet, the tube comprising sidewalls defining a flowpath through which the carrier gas flows and which includes a quantity of a precursor material therein, the sidewalls comprising an internal surface facing the flowpath having a plurality of depressions in the internal surface having a width and a depth, wherein the precursor material is disposed within the depressions; vaporizing the precursor material within the tube; and directing the vaporized precursor material via the carrier gas to a reaction chamber to deposit a material on the substrate.

The precursor vessels, vapor deposition systems, and the methods according to the current disclosure allow for more rapid vaporization of a precursor material at lower temperatures relative to the prior arts vessels, systems, and methods. In particular, the disclosed tube and the loading of the precursor material within depressions of the tube form localizes areas, deposits, or pockets (hereinafter "deposits") of the precursor material in the tube. These deposits, in turn, provide for increased surface area of the precursor material, which allows for more rapid and efficient vaporization of the precursor material for a deposition process. In certain embodiments, the tube also has an overall shape having a plurality of turns, e.g., a serpentine shape, which may allow for deposits of precursor material within the tube at the turns, thereby further increasing the distribution of and available surface area of the precursor material.

In certain embodiments, to further increase the vaporization of the precursor material, the internal volume of the vessel may further include a heat transfer fluid therein for thermal transfer with the tube to increase the efficiency of vaporization. An internal or external heat source (to the vessel) may be provided to bring the heat transfer fluid to a desirable temperature. In addition, in certain embodiments, one or more temperature regulation elements to be included with the vessel, such as within the walls of the vessel or within the internal cavity. In certain embodiments, the tube at least partially or wholly encompasses or surrounds the one or more temperature regulation elements. The temperature regulation elements may further improve the uniformity and the efficiency of the vaporization of the precursor material.

In some embodiments, due to the improvements described herein, the vaporization temperature for many precursor materials, e.g., $HfCl_4$, may be significantly reduced, e.g., by 40-50° C. or more. A reduction in vaporization temperature within the vessels, systems, and methods disclosed herein also may help prevent thermal degradation and/or undesirable agglomeration of a solid precursor material within the tube. Undesirable agglomeration tends to further reduce available surface area of the precursor material. As a result of the above features also, the amount of precursor material required to obtain a desired concentration for the associated deposition process may be significantly reduced.

BRIEF DESCRIPTION OF DRAWINGS

The accompanying drawings, which are included to provide a further understanding of the disclosure and constitute a part of this specification, illustrate exemplary embodiments, and together with the description help to explain the principles of the disclosure. In the drawings

DETAILED DESCRIPTION OF EXEMPLARY EMBODIMENTS

Figure 1:
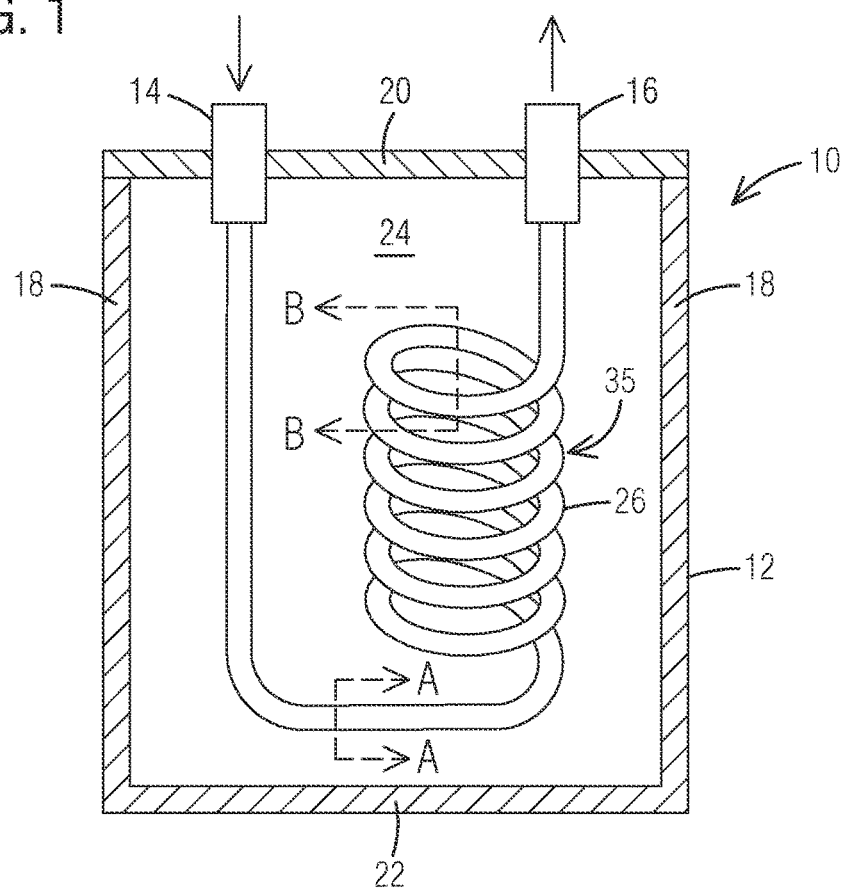
FIG. 1 illustrates an embodiment of a precursor vessel comprising a tube therein according to an aspect of the current disclosure.

The description of embodiments of precursor vessels, vapor deposition systems, and methods provided below is merely exemplary and is intended for purposes of illustration only. The following description is not intended to limit the scope of the disclosure or the claims. Moreover, recitation of multiple embodiments having stated features is not intended to exclude other embodiments having additional features or other embodiments incorporating different combinations of the stated features. For example, various embodiments are set forth as exemplary embodiments and may be recited in the dependent claims. Unless otherwise noted, the exemplary embodiments or components thereof may be combined or may be applied separate from each other.

In this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or the like. Further, in this disclosure, the terms "including," "constituted by" and "having" refer independently to "typically or broadly comprising" or "comprising." In this disclosure, any defined meanings do not necessarily exclude ordinary and customary meanings in some embodiments.

The headings provided herein are for convenience only and do not necessarily affect the scope or meaning of the claimed invention. Described herein are components, systems, and related methodologies for delivering a vaporized precursor material for a deposition process.

The precursor vessel (precursor container) includes a housing having an inlet, an outlet, and defines an interior volume in the housing. The fluid inlet and the fluid outlet are configured to transfer fluids, e.g., a purge, vaporized material, or a carrier gas with vaporized material, in and out of the precursor vessel, respectively. In some embodiments, the fluid inlet and/or fluid outlet are positioned in a lid which is fixedly or removably secured to the housing and forms part of the housing. In some embodiments, the inlet and/or outlet extend into the interior volume of the vessel. In other embodiments, the inlet and/or outlet do not extend into the interior volume and may be wholly located within a body of a lid or top portion of the vessel, for example.

As will be discussed further herein, there is disclosed a precursor vessel having a tube disposed within the interior volume and extending from the inlet to the outlet. The tube comprises sidewalls which define a flowpath through which a carrier gas flows. In particular, the tube includes sidewalls that comprise an internal surface facing the flowpath having a plurality of depressions in the internal surface and the tube has an overall shape having a plurality of turns. In certain embodiments, the tube may include a quantity of precursor material therein. When present, the precursor material is advantageously disposed within the depressions to increase the available surface area of the precursor material within the tube. In this way, the precursor can be efficiently heated and vaporized, and the precursor vapor can be swept away via a carrier gas to a vapor deposition process for deposition of a material on the substrate.

The size, precursor material, and other properties of the precursor vessel are thus selected such that the vessel is compatible with a vapor deposition process. The precursor material may be viewed as a solid composition if it is solid at standard temperature and pressure, or in the deposition conditions. On the contrary, a material may be viewed as a liquid (and not solid) composition if it is liquid at standard temperature and pressure, or in the deposition conditions.

It is also understood that the precursor material need be stable enough to allow the storage and use over an extended period of times, for example, over several weeks or even months. Additionally, the vaporization rate of the precursor material under predetermined conditions preferably remains constant. The precursor material also needs to allow the vaporization of the precursor molecule(s) so that it may be delivered to a deposition chamber for vapor deposition. Thus, the temperature and pressure ranges at which the precursor material is vaporized should be suitable for a vapor deposition process.

The terms "precursor" and "reactant" are used interchangeably in the current disclosure, and can refer to molecules (compounds, or molecules comprising a single element) that participate in a chemical reaction that produces another compound. A precursor or a reactant typically contains portions that at least partly form the compound or element resulting from the chemical reaction in question. Such a resulting compound or element may be deposited on a substrate. However, a precursor or a reactant may be an element or a compound that is not incorporated into the resulting compound or element to any significant extent.

Due to the large surface area available in the tube according to the current disclosure, in some embodiments, the precursor material may be held at ambient temperature, such as at a temperature between about 15° C. and about 35° C. In some embodiments, the precursor material may be cooled below ambient temperature, such as to a temperature between about 0° C. and about 15° C., for example to a temperature of about 5° C., or about 10° C. This may have the advantage of improving the stability of some precursor materials. A precursor vessel according to the current disclosure may be especially suitable for low vapor-pressure precursor materials. The term "low vapor-pressure precursor material" is to be understood as a relative term. The precursor material may be considered a low vapor-pressure precursor material, if the vapor pressure is limiting the efficiency or practical applicability of a given process. The vapor pressure needed for a functional vapor deposition process depends on the process in question, and also the application for which the process is used for.

A vapor deposition process according to the current disclosure may be a chemical vapor deposition (CVD) process. In other embodiments, the vapor deposition process may be an atomic layer deposition (ALD) process. Further, a vapor deposition process according to the current disclosure may be a cyclic vapor deposition process. As used herein, the term "cyclic deposition" may refer to the sequential introduction of precursors (reactants) into a reaction chamber to deposit a layer over a substrate, and includes processing techniques such as atomic layer deposition and cyclical chemical vapor deposition. Vapor deposition may be used, for example, in the manufacture of semiconductor devices in electronics industry. Thin films may be deposited on substrate by vapor deposition. As used herein, the term "substrate" can refer to any underlying material or materials that can be used to form, or upon which, a structure, a device, a circuit, or a layer can be formed.

CVD-type processes typically involve gas phase reactions between two or more precursors or reactants. The precursors or reactants can be provided simultaneously to the reaction chamber or substrate, or in partially or completely separated pulses. The substrate and/or reaction space can be heated to promote the reaction between gaseous reactants. In some embodiments, the reactants are provided until a thin film having a desired thickness is deposited. Thus, a CVD-type process may be a cyclical process or a non-cyclical process. In some embodiments, cyclical CVD-type processes can be used with multiple cycles to deposit a thin film having a desired thickness. In cyclical CVD-type processes, the reactants may be provided to the reaction chamber in pulses that do not overlap, or that partially or completely overlap.

ALD-type processes are based on controlled, typically self-limiting surface reactions of the precursor and/or reactant chemicals. Gas phase reactions are avoided by feeding the precursors alternately and sequentially into the reaction chamber. Vapor phase reactants are separated from each other in the reaction chamber, for example, by removing excess reactants and/or reactant by-products from the reaction chamber between reactant pulses. This may be accomplished with an evacuation step and/or with an inactive gas pulse or purge. In some embodiments the substrate is contacted with a purge gas, such as an inactive gas. For example, the substrate may be contacted with a purge gas between reactant pulses to remove excess reactant and reaction by-products. In some embodiments, each reaction is self-limiting and monolayer by monolayer growth is achieved. These may be referred to as "true ALD" reactions. In certain embodiments, a first precursor may adsorb on the substrate surface in a self-limiting manner. A second precursor or a reactant, and optional further reactants or precursors, will react in turn with the first adsorbed precursor to form up to a monolayer of a metal or metal compound on the substrate.

The material, size, structural details and other features of the precursor vessel disclosed are typically adapted to be used in a vapor deposition process. Since vapor deposition processes are sensitive to contamination and to other changes in process conditions, the properties of a precursor vessel may be selected as to provide as reproducible results as possible, as well as for being formed from a material and having an environment sufficiently inert not to introduce unwanted changes in the vapor composition of process gases.

By "vaporization of the precursor material" or the like as used herein, it is meant the ability of liquid or solid precursor material to become vaporized by, for example, evaporation or sublimation, and to be carried outside the precursor vessel to a reaction chamber of a vapor deposition assembly. By "vaporization conditions" or the like as used herein, it is meant the conditions under which vaporization of the precursor material is intended to take place. For example, vaporization conditions may include a pre-determined temperature and/or pressure range. Outside vaporization conditions, for example during storage or transport of the precursor vessel disclosed herein, the vaporization may or may not take place. Under other conditions than vaporization conditions, the precursor may vaporize more slowly than under vaporization conditions.

The precursor vessel according to the current disclosure comprises a housing defining an interior volume in which the tube is housed. The housing is typically substantially rigid. By "rigid" as used herein, it is generally meant self-supporting. As such, the vessel according to the current disclosure may be manufactured from any material or materials that is/are suitable for being used in a vapor deposition process. The vessel material should be inert enough not to release unwanted substances into the vapor deposition process. The vessel material should also be able to withstand the targeted vaporization conditions, such as a targeted temperature and pressure for vaporization. In certain embodiments, the vessel may be reusable. Thus, the vessel material should be amenable to an industrial cleaning process.

In certain embodiments, metals, such as stainless steel or aluminum, may be used as vessel material. In some embodiments, metal alloys, such as brass, may be used as the vessel material. Additionally, vapor deposition compatible plastic or polymeric material as are known in the art, which may be suitable as vessel material. In some embodiments, the vessel material comprises a metal. In some embodiments, the vessel material consists essentially of a metal. In some embodiments, the vessel material comprises an alloy of two or more metals. In some embodiments, the housing of the vessel further comprises a coating. Thus, the vessel material may be coated with another material, such as one that improves heat transfer to the tube within the vessel. The coating may also improve the properties of the precursor vessel, since the surface properties of the vessel may be optimized by a coating, while the vessel material may be selected based on its structural properties.

As will be discussed and shown in further detail below, the vessel may include one or more internal or external (relative to the vessel) temperature regulation elements. In some embodiments, a temperature regulation element is a heating element to provide the desired amount of heat to vaporize the precursor material within the tube of the vessel. Without limitation, the one more heating elements may include a radiant heat lamp, a resistive heater, or the like. In some embodiments, a temperature regulation element is a cooling element. In some embodiments, the one or more temperature regulation elements may regulate the temperature of the precursor vessel to a temperature from about −20° C. to about 500° C., such as to about −10° C., 0° C., 10° C., 20° C., 50° C., 70° C., 100° C., 200° C., 250° C., 300° C., 350° C. or 400° C. For example, the one or more temperature regulation elements may heat the precursor vessel to a temperature from about 50° C. to about 500° C., from about 100° C. to about 500° C., from about 200° C. to about 500° C., or from about 300° C. to about 500° C. In other embodiments, the one or more temperature regulation elements may heat the precursor vessel to a temperature from about 50° C. to about 450° C., from about 50° C. to about 400° C., from about 50° C. to about 300° C., or from about 50° C. to about 250° C. In some embodiments, a cooling element may coll the precursor vessel to a temperature from about −30° C. to about 15° C., from about −30° C. to about 5° C., from about −30° C. to about 0° C., from about 0° C. to about 15° C., or from about −5° C. to about 10° C.

The precursor vessel may have an inlet and an outlet for the flow of a carrier gas (e.g., $N_2$) through the tube, and thus the precursor vessel. The carrier gas is typically an inert gas. The carrier gas may sweep precursor vapor, for example sublimated or evaporated precursor, along with it through the vessel outlet and ultimately to a substrate in a reaction chamber. The precursor vessel typically includes isolation valves for fluidly isolating the contents of the vessel from the vessel exterior. One isolation valve may be provided upstream of the vessel inlet, and another isolation valve may be provided downstream of the vessel outlet. In some embodiments, the precursor vessel comprises, consists essentially of, or consists of a sublimator. In some embodiments, the precursor vessel comprises, consists essentially of, or consists of a vaporizer.

Depending on the application, the precursor material may be heated and/or maintained at pressures sufficient to produce a sufficient amount of precursor vapor for a vapor deposition process. Precursor vessels may be supplied with gas lines extending from the inlet and outlet, isolation valves on the lines, and fitting connectors on the valves, the fitting connectors being configured to connect to the gas flow lines of the remaining vapor deposition assembly. It is often desirable to provide a number of additional heaters for heating the various valves and gas flow lines between the precursor vessel and the reaction chamber, to prevent the precursor vapor from condensing and depositing on such components. Accordingly, the gas-conveying components between the precursor vessel and the reaction chamber are sometimes referred to as a "hot zone" in which the temperature is maintained above the vaporization/condensation/sublimation temperature of the precursor.

In an aspect, a vapor deposition system is disclosed comprising the precursor vessel having a tube as disclosed herein; a source of carrier gas, and a reaction chamber for performing a vapor deposition process, and a precursor delivery system comprising the precursor vessel connected to the reaction chamber to supply a precursor into the reaction chamber.

In still another aspect, a vapor deposition system is disclosed comprising the precursor vessel having a tube as disclosed herein and a precursor delivery system comprising the precursor vessel according to the current disclosure connected to the reaction chamber to supply precursor vapor into the reaction chamber. In an embodiment, the precursor delivery system comprises one or more injectors for introducing vaporized precursor from the precursor vessel to the reaction chamber.

In an embodiment, the reaction chamber is constructed and arranged to hold a substrate and a precursor injector system is constructed and arranged to provide a precursor into the reaction chamber in a vapor phase. The vapor deposition system comprising the precursor vessel and the precursor injector system provides vaporized precursor to the reaction chamber to deposit materials on the substrate.

In some embodiments, the vapor deposition system as disclosed herein may additionally include control processors and software configured to operate the reaction chamber to perform an ALD process. In some embodiments, the vapor deposition assembly may additionally include control processors and software configured to operate the reaction chamber to perform a CVD process.

In one aspect, a method for depositing a precursor material for a vapor deposition process is disclosed. The method comprises directing a carrier gas into a precursor vessel having a tube as described herein under vaporization conditions sufficient to vaporize the precursor material in the tube to a degree sufficient to provide a desired amount of the vaporized precursor material for delivery to a reaction chamber for deposition of a material on a substrate. The temperature may be any suitable temperature as discussed above, for example, 50 to 500° C. Thereafter, the precursor may be deposited on the substrate by any suitable process.

In view of the above, the vessels, systems, and process described herein can be utilized to provide one or more precursors or reactants as needed for deposition of a material on a substrate. It is understood that there are numerous processes for utilizing the vaporized material directly or indirectly to form the deposition of the material on the substrate. In some embodiments, the resulting vaporized precursor is directly deposited on a substrate to form a deposit of the same composition as the precursor material. In other embodiments, a first precursor may be introduced into a reaction chamber from a tube as disclosed herein (or another source) and is deposited on the substrate, and at least a second precursor may be introduced into the reaction chamber from the tube as disclosed herein (or another source) to react with the deposited first precursor on a surface of the substrate to provide a deposit of a desired composition on the substrate. In still other embodiments, the tube disclosed herein may be utilized to provide at least one of two or more precursors which react with another in the reaction chamber, and then the resulting material is deposited on the substrate.

DETAILED DESCRIPTION OF THE DRAWINGS

The disclosure is further explained by the following exemplary embodiments depicted in the drawings. The illustrations presented herein are not meant to be actual views of any particular material, structure, or device, but are merely schematic representations to describe embodiments of the current disclosure. It will be appreciated that elements in the figures are illustrated for simplicity and clarity and have not necessarily been drawn to scale. For example, the dimensions of some of the elements in the figures may be exaggerated relative to other elements to help improve the understanding of illustrated embodiments of the present disclosure. The embodiments depicted in the drawings may contain additional elements and details, which may be omitted for clarity.

FIG. 1 illustrates a precursor vessel 10 in accordance with an aspect of the present disclosure. The vessel 10 comprises a housing 12 having an inlet 14 and an outlet 16. The housing 12 may be fabricated of any suitable material, such as stainless steel, aluminum, copper, nickel, silver, alloys including the same and other components, graphite, boron nitride, a ceramic material or a combination or a mixture of said materials. In some embodiments, the material of the housing 12 may be a heat-conducting material. The precursor vessel 10 material may further be a coated or a clad material. The housing 12 defines an interior volume 24 of the precursor vessel 10 and isolates the interior volume 24 from the surrounding atmosphere. The interior volume 24 is adapted for holding a tube 26 therein as will be explained in further detail below. In some embodiments, the housing 12 comprises discernable sidewalls 18, a top portion 20, and a base or floor 22, although it is understood that the vessel 10 shape is not so limited. In certain embodiments also, the top portion 20 comprises a detachably removable lid.

In some embodiments, the housing 12 has a substantially circular cylindrical shape, and thus also a circular floor 22. However, the precursor vessel 10 may have any other suitable shape. In some embodiments, the precursor vessel 10 has substantially a shape of a rectangular prism. The shape of the precursor vessel 10 may deviate from the above-mentioned geometrical shapes due to usability, ease of manufacture, and/or handling. For example, any edges and/or corners may be rounder, or some sides at least partially slanted. In some embodiments, the floor 22 and the sidewalls 18 may not be discernable from one another. The floor 22, for example, may be curved. The housing 12 may be constructed from one part by, for example, machining. However, it is possible that the housing 12 is formed from two or more parts attached to each other in a gas-tight manner. For example, the floor 22 and the sidewalls 18 may be attachable to and separable from one another.

The size and proportions of the precursor vessel 10 may also vary according to design choices and application in question, as well as due to scale of the intended vapor deposition process or processes. In some embodiments, the height of the precursor vessel 10 is larger than its width. In some embodiments, the height of the precursor vessel 10 is equal to its width. In some embodiments, the height of the precursor vessel 10 is smaller than its width. In some embodiments, the precursor vessel 10 may have a height to width aspect ratio in the range of about 0.5 to 4, for example 1 to 2 or 1 to 3. In some embodiments, the height of the precursor vessel 10 is the outside measurement of the precursor vessel 10 from the top 20 to the floor 22 or the portion of the housing 12 furthest away from the top portion 20. The width of the precursor vessel 10 is the longest measurement across the precursor vessel 10 perpendicular to the height.

Figure 2:
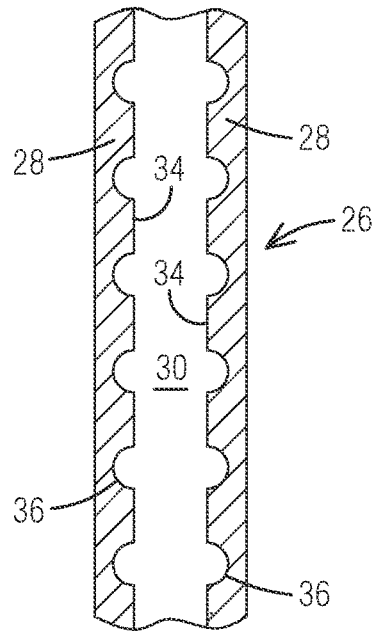
FIG. 2 illustrates a portion of the tube according to an aspect of the current disclosure taken at line A-A of FIG. 1.
Figure 3:
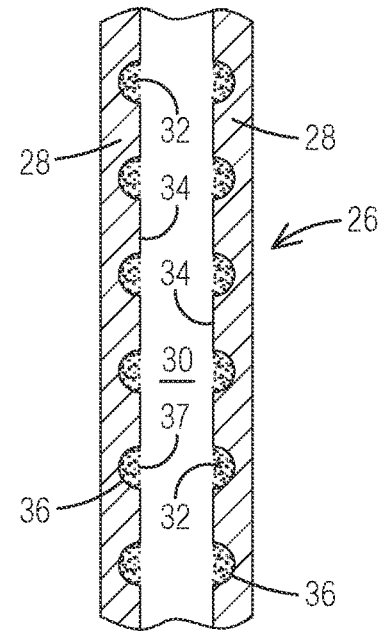
FIG. 3 illustrates the portion of the tube of FIG. 2 having precursor material within depressions thereof according to an aspect of the current disclosure.

Referring again to FIG. 1, the tube 26 extends from the inlet 14 to the outlet 16. FIG. 2 illustrates a cross-sectional view of a portion of the tube 26 taken at line A-A of FIG. 1. As shown, the tube 26 has sidewalls 28 which define a flowpath 30 within the tube 26. In particular, the sidewalls 28 comprise an internal surface 34 facing the flowpath 30 having a plurality of depressions 36 in the internal surface 34 having a depth and a width. As shown in FIG. 3, when a precursor material 32 is properly loaded into the tube 26, the precursor material 32 may be disposed within the depth of each of the depressions 36 of the tube 26. The depressions 36 have any suitable depth and width effective to create a greater amount of surface area for the precursor material 32 by providing the precursor material 32 in a large number of deposits or localized areas 37 within the tube. The fine surface structure, such as roughness, of the depressions may be selected so as to improve the adhesion of the precursor material to the surface of the depression. Further, in some embodiments, coatings may be used to improve adhesion of the precursor material to the tube surface. Also surface tension of a liquid precursor material may be taken into account in the design of the depressions.

In an embodiment, the depressions 36 have a depth of at least about 0.5 mm. In an embodiment, the depressions have a depth of at least about 1 mm. In an embodiment, the depressions 36 have a depth of at least about 2 mm. In an embodiment, the depressions have a depth of at least about 5 mm. In an embodiment, the depressions 36 have a depth of at least about 10 mm. In an embodiment, the depressions have a depth of less than about 50 mm. In an embodiment, the depressions 36 have a depth of less than about 20 mm. In an embodiment, the depressions 36 have a depth of less than about 10 mm. In an embodiment, the depressions 36 have a depth from about 0.5 mm to about 50 mm, or from about 1 mm to about 20 mm, or from about 1 mm to about 5 mm.

In an embodiment, the depressions 36 have a width of at least about 1 mm. In an embodiment, the depressions 36 have a width of at least about 2 mm. In an embodiment, the depressions 36 have a width of at least about 5 mm. In an embodiment, the depressions 36 have a width of at least about 10 mm. In an embodiment, the depressions 36 have a width of at least about 15 mm. Further, it is contemplated that the depressions 36 have any suitable shape, such as a triangular, rectangular, rounded, or other shape. The ratio between the depth and width of the depressions 36 may vary broadly. The shape, depth, width and the ratio between the depth and the width of the depressions 36 may be selected according to the precursor and the desired vaporization parameters, such as vaporization temperature and pressure, to be used.

In an embodiment, the depth to width ratio of the depressions 36 is from about 1:3 to about 4:1, or from about 1:3 to about 3:1, or from about 1:3 to about 2:1, or from about 1:3 to about 1:1. In an embodiment, the depth to width ratio of the depressions 36 is from about 1:2 to about 4:1, or from about 1:2 to about 3:1, or from about 1:2 to about 2:1, or from about 1:2 to about 1:1. As the width of a given depression 36 may vary according to the position of the depression 36 in the tube, also the depth to width ratio of the depressions 36 may vary along the length of the tube 26. In an embodiment, the depth to width ratio indicated above means the ratio for a depression 36 in a substantially straight portion of the tube 26. It is understood that the above parameters (width, depth, and aspect ratio) may apply to all or selected ones of the depressions 36 as desired.

In an embodiment, the depressions 36 may extend in a direction substantially perpendicular to the longest dimension (length) of the tube 26. Thus, the depressions 36 may extend along the circumference of the tube sidewall 28. In some embodiments, the depressions 36 may form a groove. In an embodiment, the depressions 36 define an annular groove. Annular depressions may be positioned side by side along the longest dimension of the tube 26.

In an embodiment, any given depression 36 extends helically along the longest dimension of the tube 26. There may be one helically extending depression or there may be two, three or more helically extending depressions. The two, three or more helically extending depressions 36 may be positioned substantially parallel to each other. In an embodiment, the depressions 36 may be a dimple, a hole or other substantially symmetrical depression. The depressions 36 may also be substantially evenly distributed along the tube length. Alternatively, the depressions 36 may be positioned more densely in some areas of the tube 26 than in others. For example, there may be more depressions, such as dimples or grooves, closer to the inlet 14 of the vessel 10 than to the outlet 16. The positioning of the depressions 36 may be selected to improve the vaporization of a precursor material and/or reduce the transport of non-vaporized precursor material towards the outlet 16.

It is understood that since the tube 26 may comprise turns, the width of the depressions 36 may vary according to their position in the tube 26.

In certain embodiments, the depressions 36 may be provided on opposing sidewalls 28 as shown in FIGS. 2-3. In other embodiments, the depressions 36 may be provided within only one sidewall 28 or in a non-opposed relationship. Once subjected to a suitable vaporization temperature and vaporized, the vaporized precursor material 32 may be readily swept away by a suitable carrier gas.

Exemplary precursor materials 32 that may be loaded into a precursor vessel 10 as disclosed herein include metal halides, organometallic precursors, and the like. Without limitation, the precursor material may comprise one or more of dimethyl hydrazine, trimethyl aluminum (TMA), hafnium chloride ($HfCl_4$), zirconium chloride ($ZrCl_4$), nickel chloride ($NiCl_2$), cobalt chloride ($CoCl_2$), xenon difluoride ($XeF_2$), xenon tetrafluoride ($XeF_4$), xenon hexafluoride (XeF6), indium trichloride, aluminum trichloride, titanium iodide, tungsten carbonyl, $Ba(DPM)_2$, bis di pivaloyl methanato strontium ($Sr(DPM)_2$), $TiO(DPM)_2$, tetra di pivaloyl methanato zirconium ($Zr(DPM)_4$), decaborane, boron, magnesium, gallium, indium, antimony, copper, phosphorous, arsenic, lithium, sodium tetrafluoroborates, precursors incorporating alkyl-amidinate ligands, organometallic precursors, zirconium tertiary butoxide (Zr $(t-OBu)_4$), tetrakisdiethylaminozirconium ($Zr(Net2)_4$), tetrakisdiethylaminohafnium ($Hf(Net2)_4$), tetrakis(dimethylamino)titanium (TDMAT), tertbutyliminotris(deithylamino)tantalum (TBTDET), pentakis(demethylamino)tantalum (PDMAT), pentakis(ethylmethylamino)tantalum (PEMAT), tetrakisdimethylaminozirconium ($Zr(NMe2)_4$), hafniumtertiarybutoxide ($Hf(tOBu)_4$), and combinations thereof. In some embodiments, the precursor material is solid. In some embodiments, the precursor material is liquid. Without limiting the current disclosure to any specific theory, liquid precursor materials may be retained in the depressions of the sidewalls. The suitable shape of the depressions may be selected according to the properties of the solid or liquid precursor material.

Figure 4:
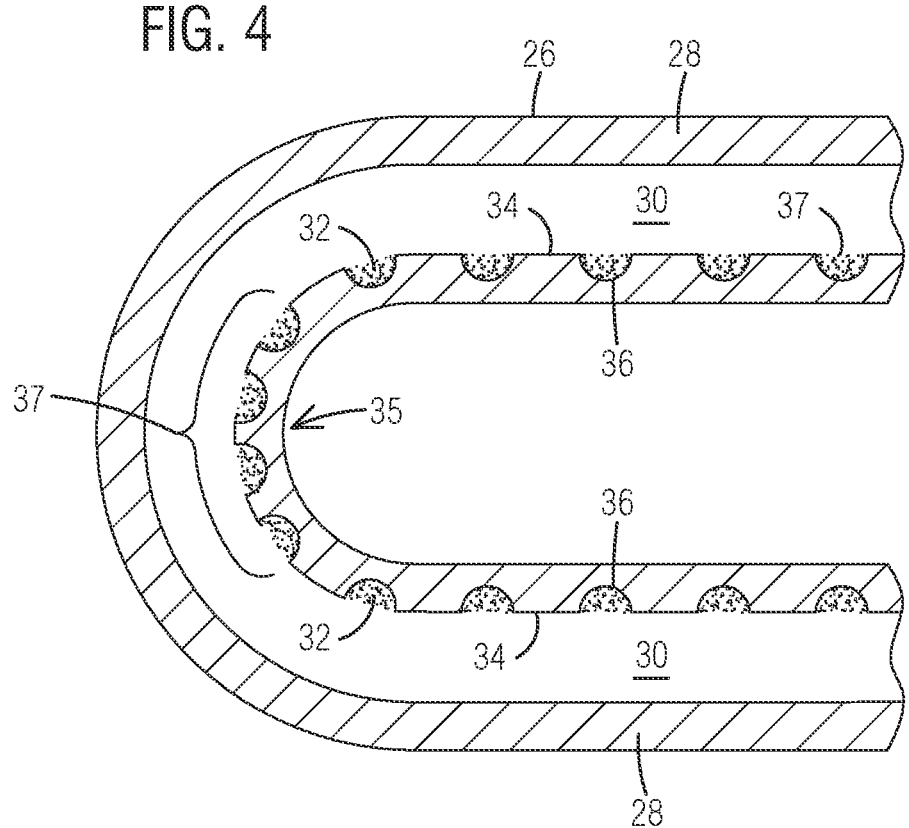
FIG. 4 illustrates a portion of the tube according to an aspect of the current disclosure taken at line B-B of FIG. 1.

In certain embodiments and as was also shown in FIG. 1, the tube 26 further includes an overall shape (outward appearance) having a plurality of turns 35 therein. In certain embodiments, the tube 26 comprises the configuration with turns 35 when installed in the vessel 10. In any case, when the tube 26 includes turns 35, as shown in FIG. 4 (taken at line B-B of FIG. 1), the precursor material 32 (when provided) may be disposed within the depressions 36, as well as at the turns 35 of the tube 26 within the interior (flowpath 30) of the tube 26.

Figure 5:
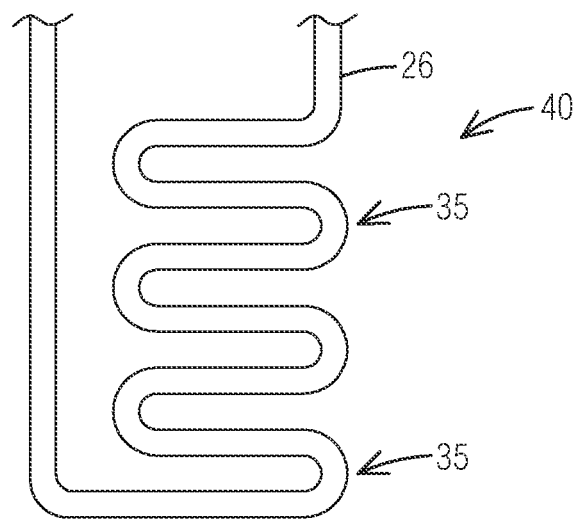
FIG. 5 illustrates a tube having a generally serpentine shape according to an aspect of the current disclosure.

The tube 26 may be of any suitable overall shape that provides for the plurality of turns 35. In an embodiment, the tube has an overall shape that comprises a serpentine shape 40 as shown in FIG. 5, wherein the tube travels in a first direction then reverses in an opposite direction at least once. Alternatively, the tube 26 may have any other suitable overall shape that provides the one or more turns 35 in the tube 26.

In some embodiments, the overall shape of the tube 26 may be helical, or the tube 26 may comprise a helical portion. For example, the tube 26 may form a helical coil. In some embodiments, the helical portion may be flanked by straight (linearly extending portions) at both ends of the tube. In some embodiments, only one of the ends of the tube 26 comprises a straight portion. In some embodiments, none of the ends of the tube 26 comprises a straight portion. In some embodiments, a temperature regulation element may also be positioned inside the space defined by a helical coil. In an embodiment, the radius of curvature in the helical portion of the curve is substantially constant.

In some embodiments, the tube 26 extends for a longer distance before the plurality of turns begins (i.e. at the inlet side of the turns) than after the plurality of turns (i.e. at the outlet side of the turns). However, in some embodiments, the tube 26 extends for a shorter distance at the inlet side of the turns than at the outlet side of the turns. In some embodiments, the tube 26 extends for approximately the same distance on both sides of the turns. In some embodiments, the tube 26 extends for a longer distance before the portion with the precursor begins (i.e. at the inlet side of the precursor-containing area) than after the precursor-containing area (i.e. at the outlet side of the precursor-containing area). However, in some embodiments, the tube 26 extends for a shorter distance at the inlet side of the precursor-containing area than at the outlet side of the precursor-containing area. In some embodiments, the tube 26 extends for approximately the same distance on both sides of the precursor-containing area.

Figure 6A:
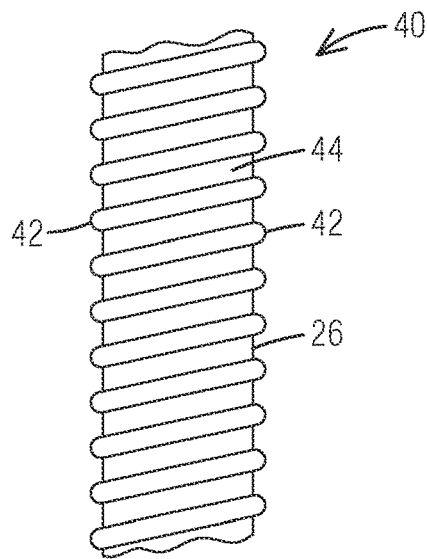
FIG. 6A illustrates a tube having outer ribs according to an aspect of the current disclosure.
Figure 6B:
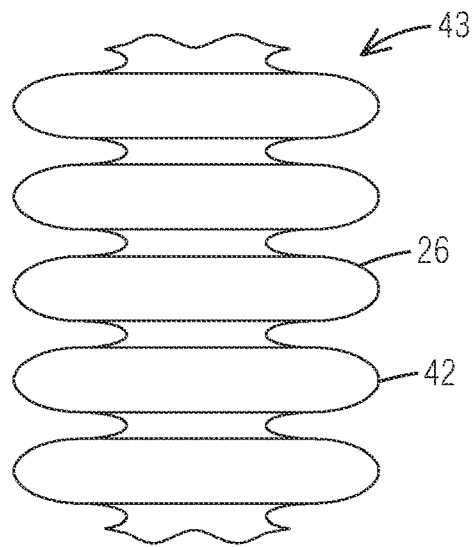
FIG. 6B illustrates a tube having a generally corrugated shape according to an aspect of the current disclosure.

The tube 26 may be formed of any material and construction that provides the features described herein. In certain embodiments, the tube 26 is provided or cut from a commercially available source of tubing. In certain embodiments and as was shown in FIG. 6A, the tube 26 may comprise a ribbed tube 40 comprising a plurality of ribs 42 on an outer surface 44 of the tube 26. In such embodiments, the ribs 42 help define the depressions 36 within the internal surface 34 of the tube 26 (see FIGS. 2-4). Suitable ribbed tubes 40 for use herein may be commercially available, such as those commercially available from the Swagelok Company. In other embodiments, the sidewalls 28 of the tube 26 may have a corrugated configuration 43 as shown in FIG. 6B having a more curved surface between adjacent ribs 42.

The precursor material 32 may be loaded into the tube 26 by any suitable method. In an embodiment, the precursor material 32 is loaded into the tube 26 while a longest dimension of the tube 26 is in a contracted or non-extended state. Thereafter, the longest dimension of the tube 26 is allowed to expand or may be expanded by mechanical means such that the precursor material 32 is allowed to settle within the depressions 36 in an internal surface 34 of the tube 26. Alternatively, or in addition, precursor material may be inserted into the tube 26 at a speed that allows the precursor material 32 to settle within the depressions 26. The precursor material 32 may be, for example, blown into the tube 26. For such filling methods, the tube 26 may be in an extended or in a contracted state. In some embodiments, the precursor material 32 may be loaded into the tube 26 by pouring a liquid or a solid precursor material 32 into the tube 26 and turning the tube 26 into various directions to disperse the precursor material throughout the tube 26. As a further alternative, the precursor material may be deposited on the tube 26 surface from gas phase. The tube 26 may have the shape, including any turns, in which it will be placed in the precursor vessel 10. Once the precursor material 32 is loaded into the tube 26, the ends of the tube 26 may be closed via suitable fitting connectors or plugs. The settling of the precursor material inside the tube 26 may be aided or improved by, for example, moving or heating the tube 26. The tube 26 may then be stored, shipped, and/or immediately installed within the precursor vessel 10 for vaporization of the precursor material 32 therein. In some embodiments, the tube 26 may already be positioned in the precursor vessel 10 when being filled. In some embodiments, the tube 26 may be attached to a lid of a precursor vessel 10 when being filled.

The tube 26 may comprise any suitable length, diameter, and width, and other dimensions suitable to provide sufficient vaporized precursor material for the intended deposition process. In an embodiment, the tube 26 has a longest dimension of at least 10 cm, or of at least 20 cm, or of at least 50 cm, or of at least 100 cm, or of at least 150 cm. In an embodiment, the tube 26 has a longest dimension from about 10 cm to about 200 cm, or from about 20 cm to about 200 cm, or from about 40 cm to about 200 cm, or from about 50 cm to about 200 cm, or from about 70 cm to about 200 cm. In an embodiment, the tube 26 has a longest dimension from about 10 cm to about 20 cm, or from about 10 cm to about 40 cm, or from about 10 cm to about 50 cm, or from about 10 cm to about 70 cm, or from about 10 cm to about 100 cm. Typically, the longest dimension is in the direction of the flowpath 28.

In an embodiment, the tube has an internal diameter (i.e. the diameter of the flowpath) of from about 5 mm to about 50 mm, or from about 5 mm to about 40 mm, or from about 5 mm to about 30 mm, or from about 5 mm to about 20 mm, or from about 5 mm to about 10 mm, or from about 10 mm to about 50 mm, or from about 15 mm to about 50 mm, or from about 20 mm to about 50 mm, or from about 30 mm to about 40 mm, or from about 10 mm to about 30 mm. In embodiments where the tube 26 has a non-circular cross-section, the internal diameter may be considered the smallest width of the flowpath.

In an embodiment, the tube 26 has an outer diameter of from about 7 mm to about 65 mm, or from about 7 mm to about 55 mm, or from about 7 mm to about 45 mm, or from about 7 mm to about 25 mm, or from about 7 mm to about 15 mm, or from about 15 mm to about 65 mm, or from about 15 mm to about 50 mm, or from about 20 mm to about 50 mm, or from about 30 mm to about 40 mm, or from about 10 mm to about 30 mm. In embodiments where the tube 26 has a non-circular cross-section, the outer diameter may be considered the smallest width of the flowpath 30.

In an embodiment, the thickness of a sidewall 28 of the tube 26 is substantially constant. In some embodiments, the thickness of a sidewall 28 is from about 0.5 to 2 mm.

Figure 7:
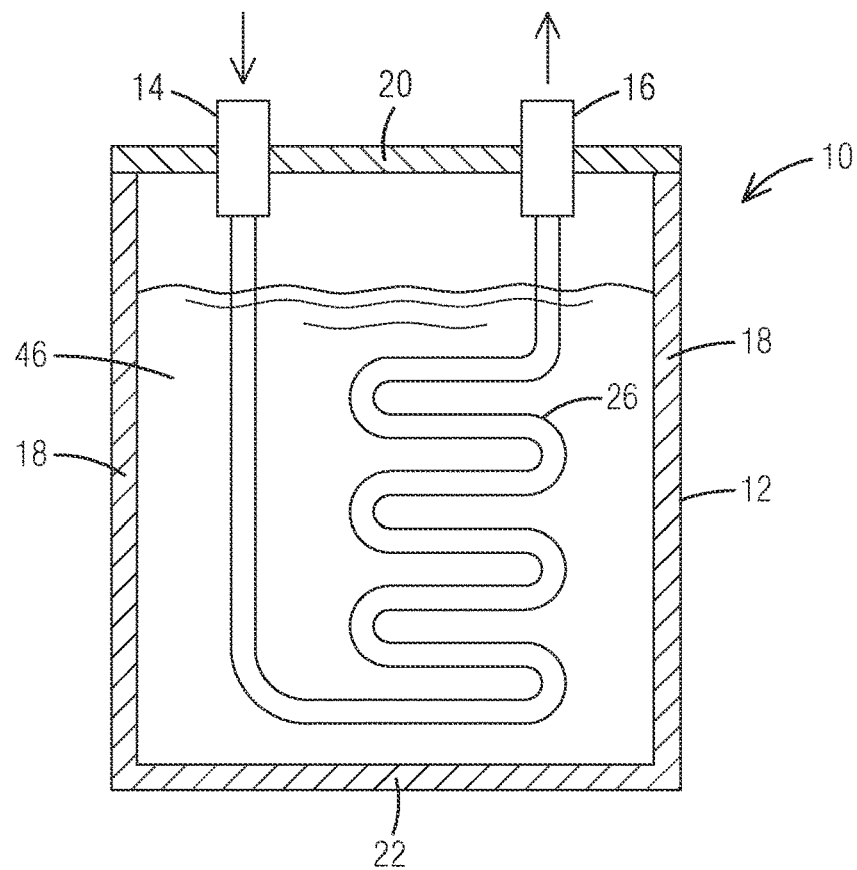
FIG. 7 illustrates a precursor vessel having a heat transfer fluid therein according to an aspect of the current disclosure.

Referring now to FIG. 7, in certain embodiments, the interior volume 24 of the vessel 10 may further comprise a heat transfer fluid 46 therein. In certain embodiments, the heat transfer fluid 46 surrounds at least a portion of the tube 26. Upon heating of the heat transfer fluid 46 to a predetermined temperature, the heat transfer fluid 46 at least facilitates vaporization of the precursor material 32 in the tube 26 by thermal transfer from the heat transfer fluid 46 to the tube 26. The heat transfer fluid 46 preferably has a relatively high boiling point so as to not itself boil or vaporize under the vaporization conditions for the precursor material 32. Accordingly, in certain embodiments, the heat transfer fluid 44 has a boiling point of at least 200° C., 250° C., 300° C., 350° C., or even at least 400° C. In some embodiments, the heat transfer fluid 46 comprises a polymer or a hydrocarbon material. The heat transfer fluid 46 may be selected according to the intended vaporization temperature in each application. In particular embodiments, the heat transfer fluid 46 comprises a fluid sold under the trade name Fomblin and commercially available from Solvay USA, Inc., for example.

Figure 8:
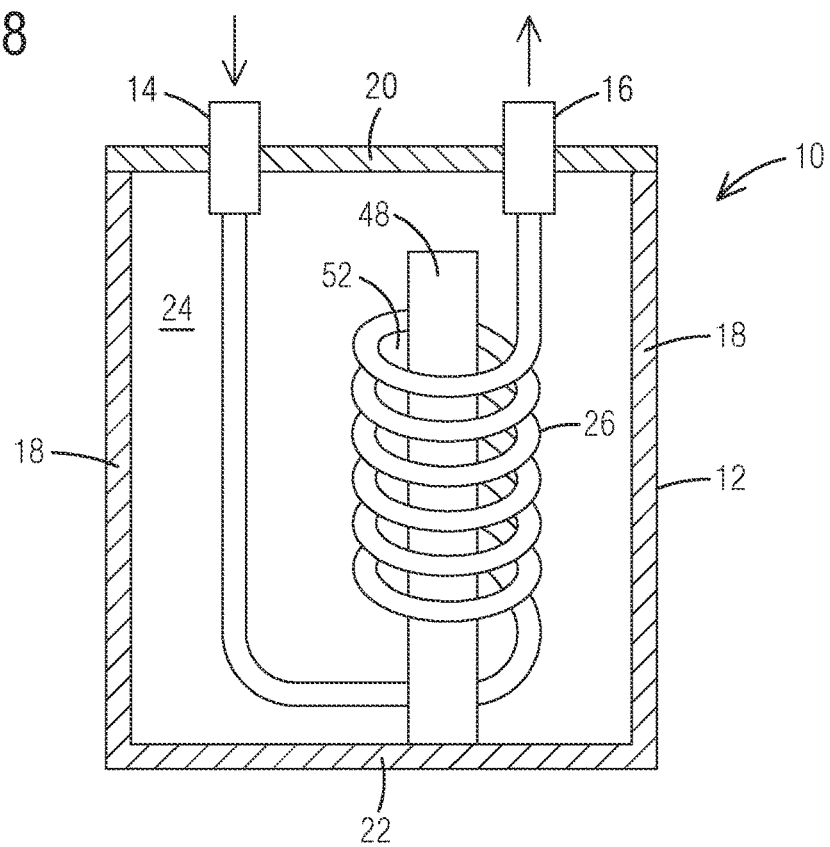
FIG. 8 illustrates a precursor vessel having a temperature regulation element arranged within an interior volume thereof according to an aspect of the current disclosure.
Figure 9:
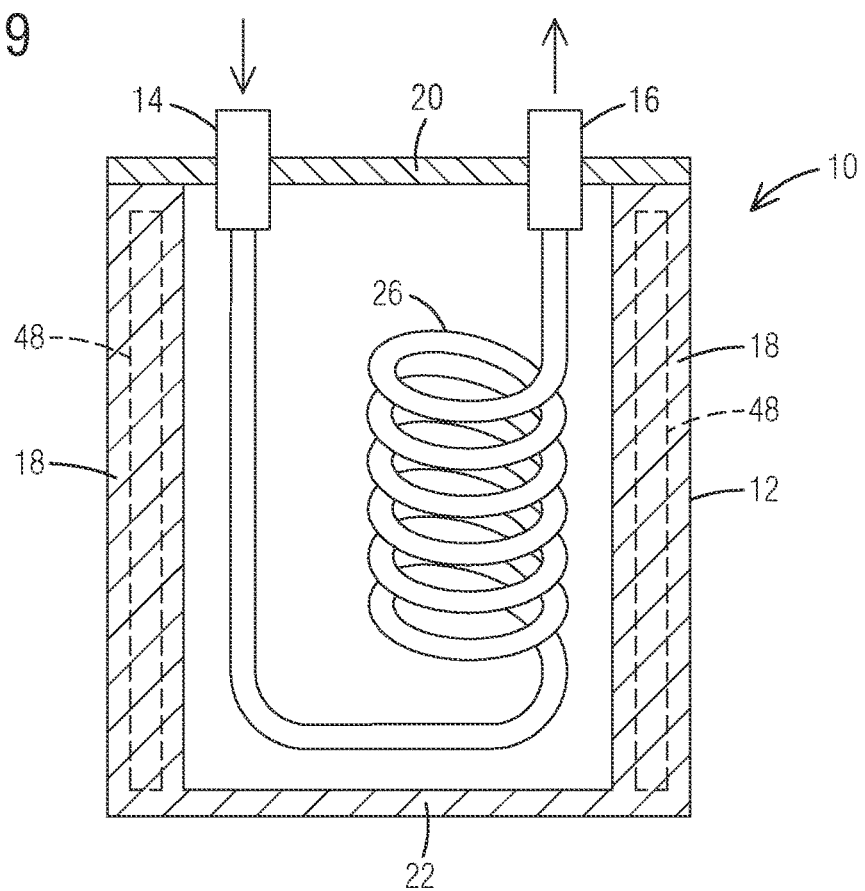
FIG. 9 illustrates a precursor vessel having a temperature regulation element disposed within an external wall of the vessel according to an aspect of the current disclosure.

In accordance with another aspect, to facilitate the efficiency (e.g., allow for reduced vaporization time and temperature), the precursor vessel 10 may further include a plurality of heater or temperature regulation elements 48 (hereinafter "temperature regulation elements 48") located within the vessel 10 as shown in FIGS. 8-9. These temperature regulation elements 48 may be in addition to or alternatively utilized instead of any heaters or temperature regulation elements external of the vessel 10. By locating one or more temperature regulation elements 48 within the vessel 10, the one or more temperature regulation elements 48 may efficiently provide thermal energy directly or indirectly (when a heat transfer fluid is utilized) to the tube 26 to vaporize the precursor material 32 therein.

In the embodiment shown in FIG. 8, the vessel 10 comprises a tube 26 as disclosed herein within the interior volume 24 of the tube 26, as well as a temperature regulation element 48 extending from the floor 22 of the housing 12 of the vessel 10 and within a space 52 defined by a shape of the tube 26. In this way, at least a portion of the temperature regulation element 48 is encompassed or surrounded by the tube 26 and is able to provide thermal energy to the tube 26 to vaporize the precursor material 32 (when loaded in the tube 26). Various heater arrangements are known in the art, and a suitable temperature regulation element 48 may be selected according to the vapor deposition system used. In other embodiments, the vessel 10 may also or instead include temperature regulation elements 48 disposed within an exterior portion of the vessel 10, e.g., sidewalls 18, top 20, and/or floor 22. FIG. 9 shows, for example, a vessel 10 comprising temperature regulation elements 48 within sidewalls 18 of the vessel 10.

Figure 10:
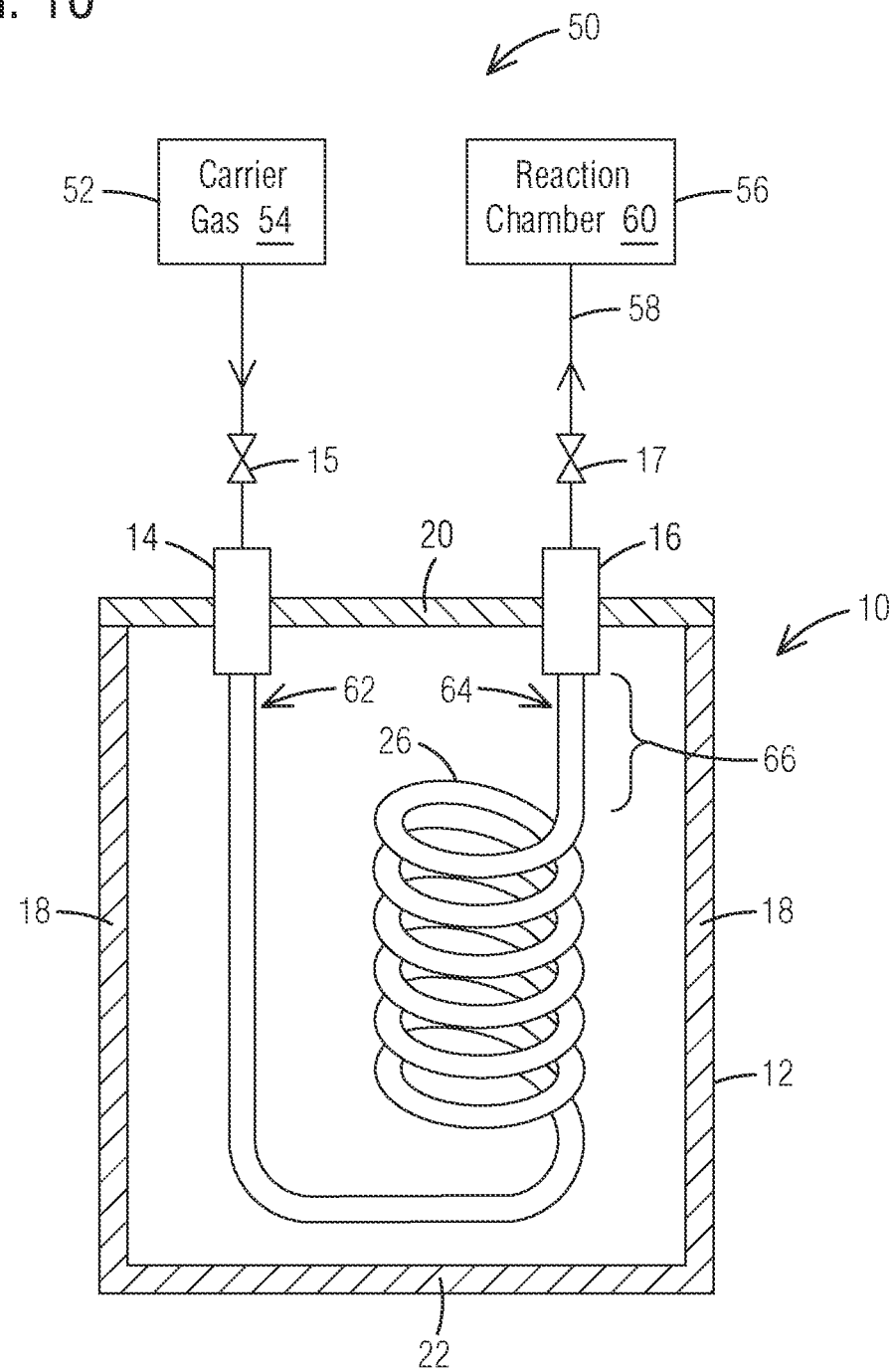
FIG. 10 illustrates a vapor deposition system according to an aspect of the current disclosure.

In accordance with another aspect and as shown in FIG. 10, there is disclosed a system 50 including a vessel 10 as disclosed herein. The vapor deposition system 50 can be used to carry out a vapor deposition process which may be, for example, a CVD-type process, an ALD-type process, or a hybrid thereof. In the embodiment shown, the system 50 includes a source 52 of a carrier gas 54 in fluid communication with the inlet 14 of the vessel 10. In addition, the system 50 includes a reaction chamber 56 in fluid communication with the outlet 16 of the vessel to receive a vaporized precursor material 58 (along with carrier gas 54) from the tube 26 of the vessel 10. In certain embodiments, the inlet 14 may comprise an inlet valve 15 arranged to selectively introduce the carrier gas 54 into the tube 26 within the precursor vessel 10 when the inlet valve 15 is open. In addition, the outlet 16 may comprise an outlet valve 17 arranged to selectively release carrier gas 54 containing vaporized precursor material into the reaction chamber 56 when the outlet valve 17 is open. When connected to the reaction chamber 56, it is contemplated that there may be provided additional gas lines extending from the inlet 14 and outlet 16 of the vessel 10, isolation valves on the lines, and fitting connectors on the valves, the fitting connectors being configured to connect to the gas flow lines as necessary. Although one vessel 10 is illustrated in the system 50, it is contemplated that more than one vessel 10 as disclosed herein may be provided in fluid communication with the reaction chamber 56.

In operation and in certain embodiments, the precursor vessel 10 and tube 26 is heated to a temperature effective to vaporize at least a portion, if not all, of the precursor material 32 within the tube 26. In some embodiments, the tube 26 is loaded with the precursor material 32 and then capped with a suitable fitting connector, inserted into the vessel 10, and properly mated with the inlet 14 and the outlet 16 of the vessel 10. In certain embodiments, the tube 26 is pre-loaded with the precursor material 32 and is inserted into the vessel 10 by connecting one end of the tube to the inlet 16 and the other end of the tube to the outlet 18 of the vessel. Once the precursor material 32 is vaporized to a suitable degree, the carrier gas 54 is allowed to flow through the flowpath 30 of the path to sweep away vaporized precursor material 58 and deliver the vaporized precursor material 58 to the reaction chamber 56. A substrate 60 is located within the reaction chamber 56 for deposition of a material thereon resulting directly or indirectly from the vaporized precursor material 58. As discussed above, the system 50 and precursor vessel 10 may be arranged to operate at a vaporization temperature of 30° C. to 500° C. depending on the precursor materials and applications involved.

In certain embodiments, the tube 26 and/or any flowpaths, e.g., tubing, piping, or the like, leading to and/or from the tube 26 may include one or more filters (not shown) therein for preventing particulate matter from being directed to the reaction chamber 56. In still other embodiments and as is also shown in FIG. 10, the tube 26 includes a proximal end 62 extending from the inlet 14 and a distal end 64 leading to the outlet 16. In this embodiment, the distal end 64 comprises at least a linearly extending portion 66. In this way, at least some particulate matter (precursor material 32) which is not fully vaporized and is swept away by the carrier gas 54 may settle and not be carried by the carrier gas 54 to the reaction chamber 56. In certain embodiments, the vessel 10 comprises a top portion (FIG. 1) and a base portion 22, and the linearly extending portion 66 extends vertically between the top portion 20 and the base portion 22. The linearly extending portion 66 may be of any suitable length for the intended purpose of reducing or eliminating particulate matter being carried away to the reaction chamber 54.

The system and precursor vessel 10 may comprise additional features that are omitted from the figure for clarity. For example, the precursor vessel 10 may comprise any additional structures for enabling efficient precursor vaporization of the precursor material 32. To this end, various precursor holding structures or carrier gas guiding arrangements may be present in the interior volume 24 of the precursor vessel 10. In certain embodiments, the precursor vessel 10 or any component of the system 50 may further comprise structures for avoiding precursor particles from being caught in the carrier gas stream flowing from the tube 26 to the reaction chamber 56. Various filters or other entrapment structures may be used within the tube or associated gas lines, for example. Additionally, the inlet 14 and the outlet 16, as well as gas lines extending therefrom may comprise heaters for heating the various valves and gas lines between the precursor vessel 10 and the reaction chamber to prevent the precursor vapor from condensing and depositing on any components.

Figure 11A:
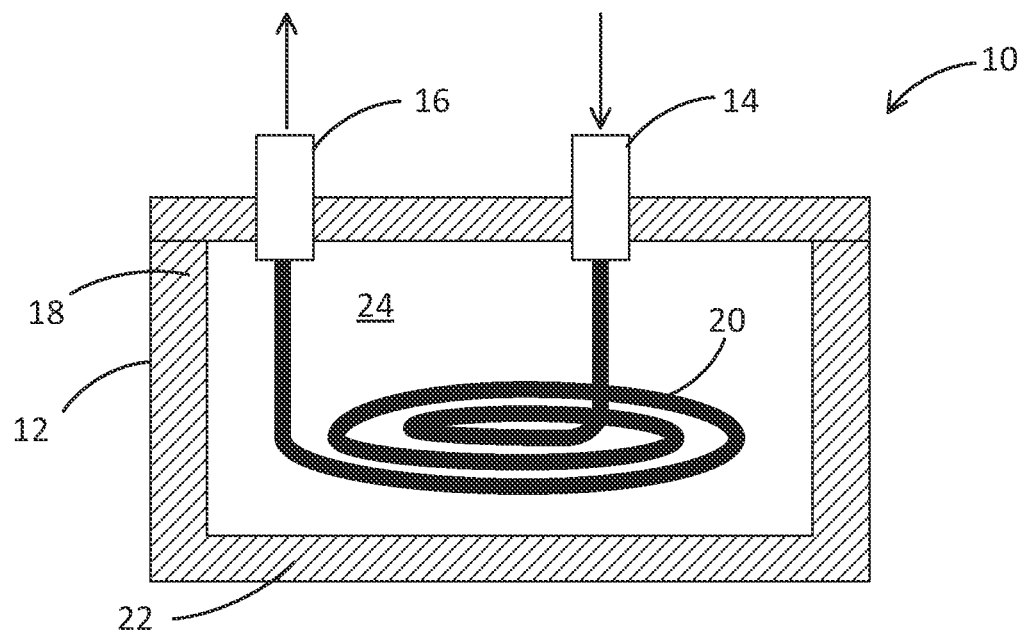
FIG. 11A illustrates an embodiment of a precursor vessel having a spiral-shaped tube therein.

FIG. 11A depicts yet another embodiment of a precursor vessel 10 according to the current disclosures. In this embodiment, the tube 26 is spirally formed, and the spiral-shaped portion of the tube 26 extends substantially parallel to the floor 22 of the precursor vessel 10. The tube 26 comprises a straight portion at its both ends. The straight portions have substantially the same length. The structure of the tube 26, the inlet 14, the outlet 16, the housing 12, as well as other structures of the precursor vessel 10 may be constructed as described above. Although in the embodiment of FIG. 11A, the tube 26 forms a substantially flat spiral, in some embodiments, the spiral may deviate from a substantially flat shape. For example, the spiral may form an approximate funnel shape, such that the inner part of the funnel is positioned further away from the floor 22 of the precursors vessel 10 than the outer part of the spiral. In some embodiments, the inner part of the spiral may be the inlet 14 end of the tube 26. In such embodiments, the straight portion of the tube 26 extending towards the outlet 16 may be longer than the straight portion of the tube 26 extending from the inlet 14. Such configuration may have advantages in reducing the amount of precursor carried with the carrier gas towards the outlet 16.

Figure 11B:
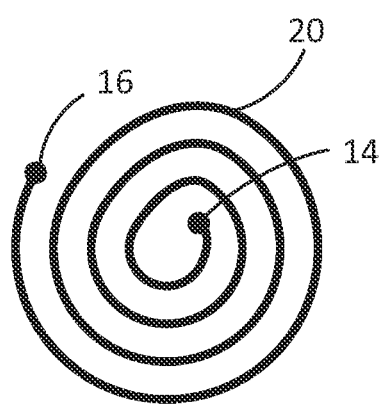
FIG. 11B is a top view of the precursor vessel shown in FIG. 11A.

FIG. 11B is a top view of the tube 26 of the embodiment of FIG. 11A. The inlet and outlet ends, 14 and 16, respectively, are indicated in the drawing. The spiral shape may have a suitable number of turns to achieve the intended surface area of the precursor. In FIG. 11B, the tube comprises approximately 3.5 circular turns, but the number may vary broadly, for example from about 2 to about 20, or even higher.

Reference throughout this specification to "one embodiment" or "an embodiment" means that a particular feature, structure, or characteristic described in connection with the embodiment is included in at least one embodiment of the present invention. Thus, appearances of the phrases "in one embodiment" or "in an embodiment" in various places throughout this specification are not necessarily all referring to the same embodiment.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and example of the present invention may be referred to herein along with alternatives for the various components thereof. It is understood that such embodiments, examples, and alternatives are not to be construed as de facto equivalents of one another, but are to be considered as separate and autonomous representations of the present invention.

Furthermore, the described features, structures, or characteristics may be combined in any suitable manner in one or more embodiments. In the following description, numerous specific details are provided, such as examples of lengths, widths, shapes, etc., to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

While the forgoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

PARTS LIST 10 vessel
12 housing
14 inlet
15 inlet valve
16 outlet
17 outlet valve
18 sidewalls
20 top
22 floor
24 interior volume
26 tube
28 walls of tube
30 flowpath
32 precursor
34 internal surface
35 turns
36 depressions
37 deposits
38 ribbed tube
40 serpentine shape
42 ribs
43 corrugated configuration
44 outer surface
46 heat transfer fluid
48 temperature regulation elements
50 system
52 source
54 carrier gas
56 reaction chamber
58 vaporized material
60 substrate
62 proximal end
64 distal end
66 linearly extending portion

The invention claimed is:

1. A vapor deposition system comprising:
a precursor vessel comprising:
a housing having an inlet for receiving a carrier gas, an outlet, and defining an interior volume; and
a tube disposed within the interior volume and extending from the inlet to the outlet, the tube comprising sidewalls defining a flowpath there through;
wherein the sidewalls comprise an internal surface facing the flowpath having a plurality of depressions in the internal surface having a depth and a width,
wherein the plurality of depressions comprise at least four depressions evenly distributed along a length of the tube, and
wherein a precursor material is disposed within the plurality of depressions.

2. The system according to claim 1, wherein the tube further includes an overall shape having a plurality of turns, wherein the plurality of depressions further comprise additional depressions that are more densely distributed together compared to the at least four depressions evenly distributed along a length of the tube, and wherein the additional depressions that are more densely distributed together are located at the plurality of turns.

3. The system according to claim 2, wherein the overall shape having a plurality of turns comprises a serpentine shape.

4. The system according to claim 1, wherein the interior volume further comprises a heat transfer liquid therein for thermal exchange with at least a portion of the tube.

5. The system according to claim 4, wherein the heat transfer liquid comprises a polymer or a hydrocarbon material.

6. The system according to claim 1, further comprising a temperature regulation element disposed within a space defined by the tube such that at least a portion of the temperature regulation element is encompassed by the tube.

7. The system according to claim 1, further comprising a temperature regulation element disposed within an interior of a wall of the vessel.

8. The system according to claim 1, wherein the tube comprises a proximal end extending from the inlet and a distal end leading to the outlet, and wherein the distal end of the tube comprises a linearly extending portion.

9. The system according to claim 1, wherein the precursor vessel is arranged to operate at a vaporization temperature of −20° C. to 500° C.

10. The system according to claim 1, wherein the precursor material is solid.

11. A vapor deposition system comprising:
a source of a carrier gas;
a reaction chamber for holding a substrate therein; and
a precursor vessel comprising:
a housing having an inlet in fluid communication with the source of carrier gas, an outlet in fluid communication with the reaction chamber, and defining an interior volume; and
a tube disposed within the interior volume and extending from the inlet to the outlet, the tube comprising sidewalls defining a flowpath there through which a carrier gas from the carrier gas source flows and includes a quantity of a precursor material therein,
wherein the sidewalls comprise an internal surface facing the flowpath having a plurality of depressions in the internal surface having a width and a depth,
wherein the plurality of depressions comprise at least four depressions evenly distributed along a length of the tube, and
wherein the precursor material is disposed within the plurality of depressions.

12. The system according to claim 11, wherein the tube further includes an overall shape having a plurality of turns, wherein the plurality of depressions further comprise additional depressions having precursor material therein, and wherein the additional depressions are located at the plurality of turns and are more densely distributed together compared to the at least four depressions evenly distributed along a length of the tube.

13. The system according to claim 12, and wherein the precursor material is disposed at the plurality of turns of the tube within the flowpath.

14. The system according to claim 11, wherein the interior volume further comprises a heat transfer liquid therein for thermal exchange with at least a portion of the tube.

15. The system according to claim 14, wherein the heat transfer liquid comprises a polymer or a hydrocarbon material.

16. The system according to claim 11, further comprising a temperature regulation element disposed within a space defined by the tube such that at least a portion of the temperature regulation element is encompassed by the tube.

17. The system according to claim 11, further comprising a temperature regulation element disposed within an interior of a wall of the vessel.

18. The system according to claim 11, wherein the tube comprises a proximal end extending from the inlet and a distal end leading to the outlet, and wherein the distal end of the tube comprises a linearly extending portion.

19. The system according to claim 11, wherein the precursor material is solid.

20. A vapor deposition process comprising:
   (i) directing a carrier gas into a precursor vessel comprising an inlet, an outlet, and defining an interior volume, wherein the vessel further comprises a tube disposed within the interior volume extending from the inlet to the outlet, the tube comprising sidewalls defining a flowpath through which the carrier gas flows and which includes a quantity of a precursor material therein, the sidewalls comprising an internal surface facing the flowpath having a plurality of depressions having a width and a depth, wherein the plurality of depressions comprise at least four depressions evenly distributed along a length of the tube, and wherein the precursor material is disposed within the plurality of depressions;
   (ii) vaporizing the precursor material within the tube; and
   (iii) directing the vaporized precursor material via the carrier gas to a reaction chamber for material deposition on a substrate.

21. The process according to claim 20, wherein the tube further includes an overall shape having a plurality of turns, and wherein the precursor material is disposed at the plurality of turns of the tube within the flowpath.

* * * * *